HIGH FREQUENCY TUNERS

Filed Oct. 27, 1954 2 Sheets-Sheet 1

INVENTOR.
SEYMOUR NAPOLIN
BY
ATTORNEY

April 15, 1958 S. NAPOLIN 2,831,117

HIGH FREQUENCY TUNERS

Filed Oct. 27, 1954 2 Sheets-Sheet 2

INVENTOR.
SEYMOUR NAPOLIN

BY Theodore Haper

ATTORNEY 2,831,117

HIGH FREQUENCY TUNERS

Seymour Napolin, Williston Park, N. Y., assignor to Granco Corporation, Long Island City, N. Y., a corporation of New York Application October 27, 1954, Serial No. 465,117

8 Claims. (Cl. 250—40)

This invention relates to tuning devices especially those applicable to high frequency as well as very high frequency wave ranges such as broadcasting or telecasting reception and transmission.

One of the objects of the invention is to provide a high frequency tuning device of extremely simple construction, inexpensive in manufacture and assembly, and facilitating ready incorporation in or connection to existing radio and television apparatus.

Another object of the invention is a tuning device comprising to a great extent stamped metal parts forming inductances or inductance portions, and serving simultaneously as circuit elements as well as supports and connectors.

A more specific object of the invention is an inductance element in the form of a metal plate having side flaps supporting one or more preferably cylindrical condenser electrodes coaxially extending over that inductance plate thereby forming a complete and very compact tuning circuit.

A further object of the invention is to provide a stamped metal plate forming an inductance element and supporting at least one adjustable tuning condenser on side flaps thereof, with additional side flaps permitting connection of the tuning circuit thus constituted with oother circuit elements of a radio or television receiver or any other desired circuitry.

Still another object of the invention is to support on a sheet metal plate representing an inductance element in an oscillator or mixer circuit, which supports a tube socket and at least one adjustable condenser on one side thereof and which in turn is supported on the bottom side of a chassis panel with the tube socket facing with one side or its contact making side the electrodes of the condenser, and facing with its other or tube receiving side an opening in the chassis through which the corresponding oscillator and/or mixer tube fitting this socket can be inserted so as to project therefrom in otherwise well known manner.

In this way the electrical connections between tuning device, tube and any other circuit element or elements are reduced to a minimum.

A more specific object of the invention is to provide a simple attachment mechanism between a tube cover and the opening in the chassis panel which supports the inductance plate attached to that chassis panel and forms a tuning device with at least one adjustable condenser supported over and on such inductance plate.

In this manner a tube socket can be supported on the inductance plate with one side facing the condenser electrodes and the other side facing the opening in the chassis panel.

Still another object of the invention is to support several adjustable condensers on side flaps of an inductance element formed of sheet metal and to support on the electrodes of the condenser tuning adjustment elements or plates whereby at least some of these supporting means also serve as conducting means thereby reducing electrical connections to a minimum and facilitating assembly of the tuning device as well as its mechanical and electrical incorporation in other apparatus or circuits.

These and other objects of the invention will be more fully understood from the drawings annexed herewith in which Figs. 1 and 2 in top and rear views respectively represent a tuning device incorporating certain features of the invention.

Figures 4, 5, 6, 7, 8, 9:
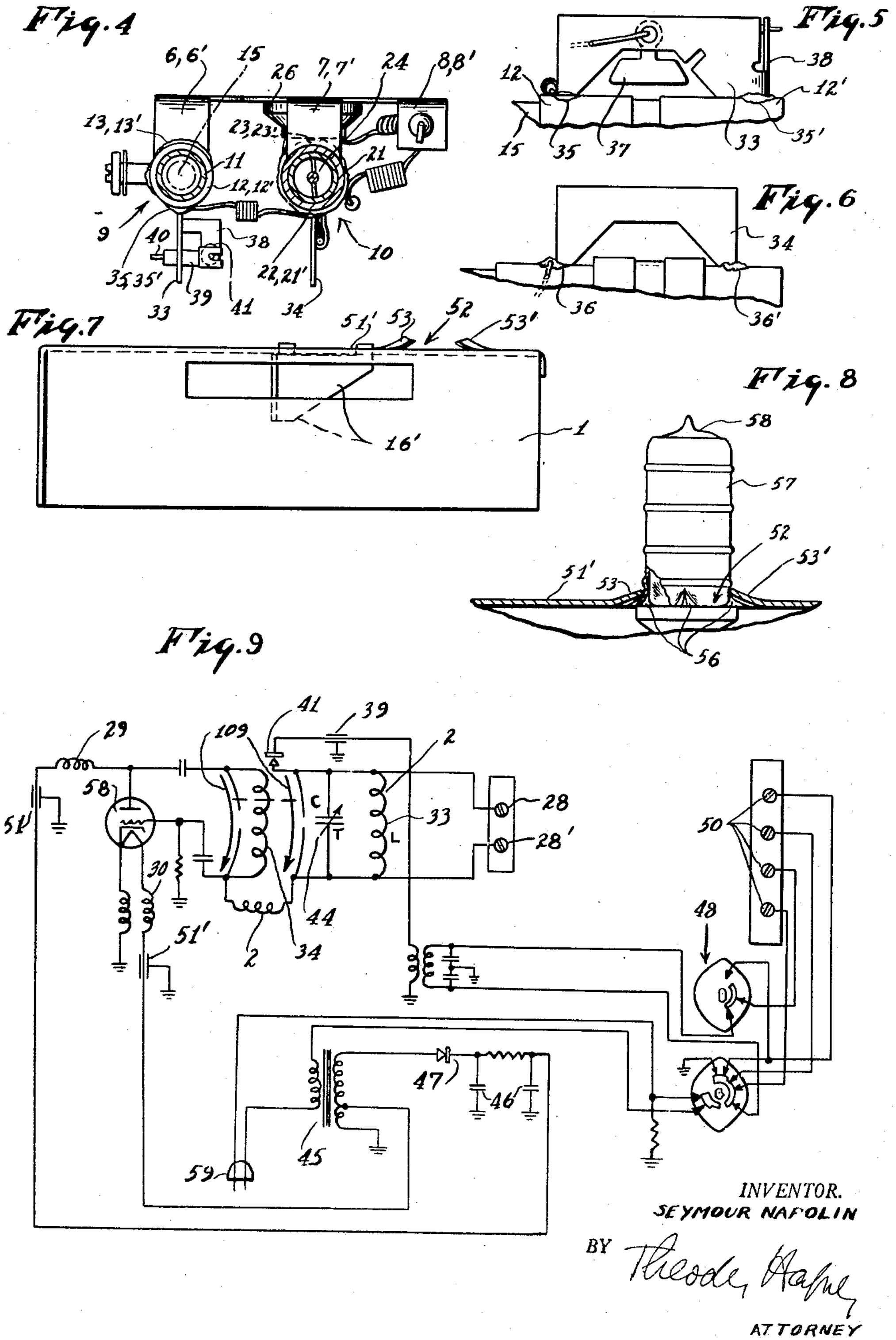
Fig. 4 represents a cross section of Fig. 3 along lines 4—4.
Figs. 5 and 6 represent certain tuning adjustment elements associated with the tuning circuit.

Figs. 7 and 8, the latter in section, represent in front elevation a chassis panel incorporating other features of the invention and preferably cooperating with a tuning device such as shown in Figs. 1 to 6.

Fig. 9 shows a circuit diagram of a tuning circuit such as illustrated in Figs. 1 through 6.

Figure 1:
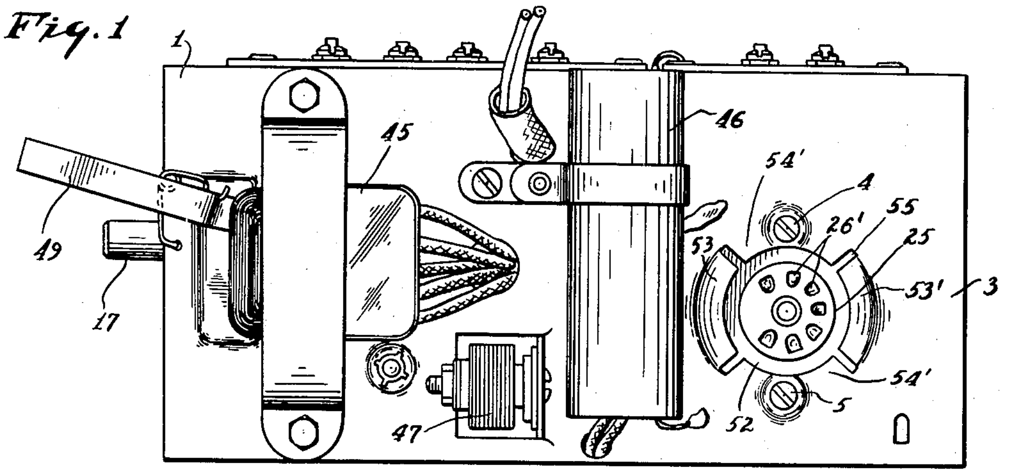
Figures 2, 3:
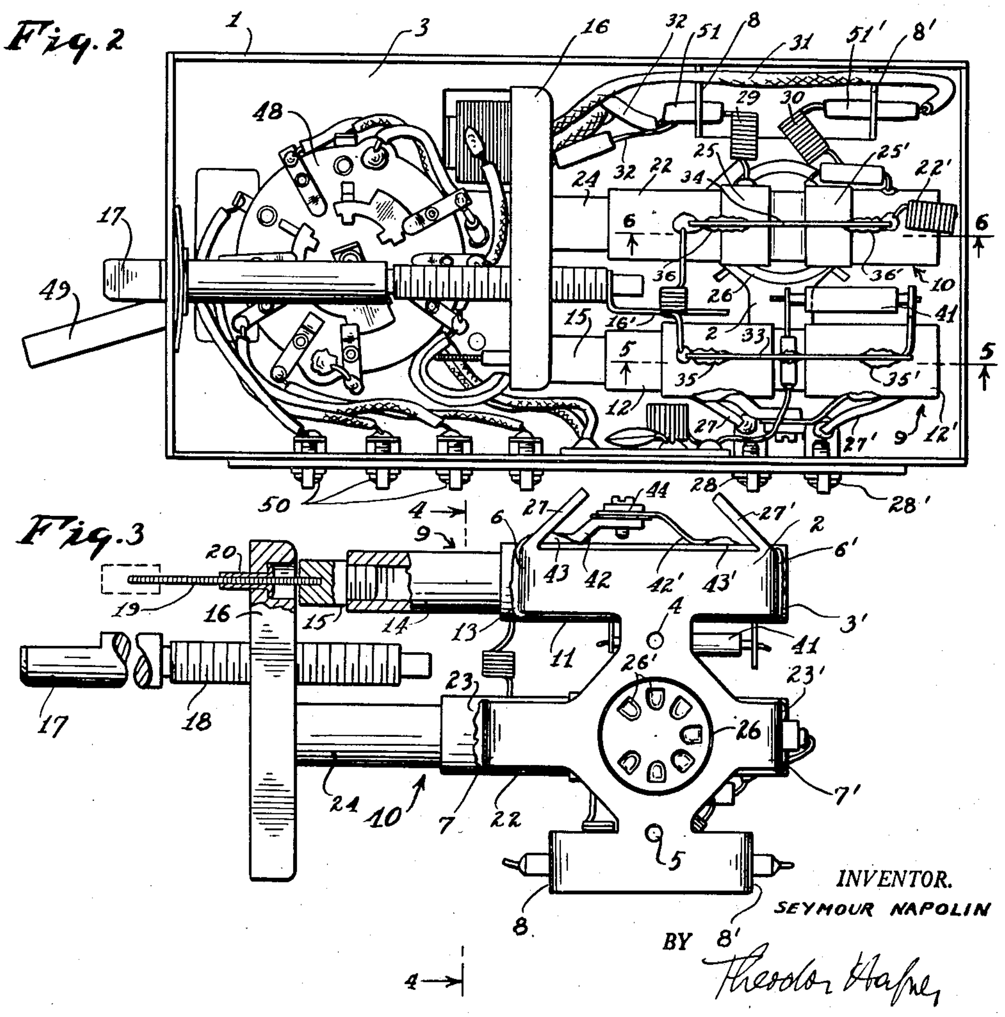
Fig. 3 represents certain elements of the tuning circuit proper with part of it in section.

In Figs. 1 and 2 a high frequency tuning circuit or device used for a television or frequency modulation radio receiver, is shown to be supported on a chassis 1 by means of its inductance element which is in the form of a stamped sheet metal plate 2 attached to chassis panel 3 by screws 4 and 5 respectively. Inductance plate 2 has the shape more closely indicated in Fig. 3 and is provided with pairs of perpendicular side flaps more closely indicated in Fig. 4 at 6, 6', 7, 7', and 8, 8', respectively.

Side flaps 6, 6' and 7, 7' serve simultaneously to connect electrically and support mechanically a pair of adjustable condensers 9 and 10 respectively, which form together with inductance plate 2 a combined mixer and tuner circuit for example with condenser 9 representing an antenna-mixer condenser and condenser 10 representing an oscillator-tuning condenser. Each of condensers 9, 10 is of otherwise well known and similar construction, except that condenser 9 in addition to being adjustable simultaneously with condenser 10 is shorter in length and also additionally adjustable, substantially independently from condenser 10 as will be explained further below.

Condenser 9 consists of an insulating tube made of borosilicate glass or the like indicated at 11 and supporting at its outside a pair of cylindrical electrodes applied in any known manner or preferably in a manner representing another feature of the invention as will be explained further below.

The two electrodes of condenser 9 are indicated in Fig. 2 at 12, 12' respectively and they are connected at and supported on their circumferences and their outer ends respectively by perpendicular side flaps 6, 6' respectively, of inductance plate 2.

These connections which represent electrical as well as mechanical connections are indicated in Figs. 3 and 4 by solder points 13, 13', respectively.

Adjustment of condenser 9 is caused to occur by means of a metallic or metallized plunger or plunger tube 14, supported on an insulating tube 15 which in turn is mounted on an adjustment bracket 16.

Adjustment bracket 16 in turn is held through a threaded opening (not shown) on adjustment bolt or shaft 17 provided with a threaded portion 18 fitting into the corresponding opening (not shown) of adjustment bracket 16.

Adjustment bolt or shaft 17 is rotatably supported near one end thereof on the front portion of chassis 1 as schematically indicated in Figs. 1 and 2 and by its rotation will cause movement of adjustment bracket 16 in axial direction. The other end is rotatedly supported on a triangular plate 16, also diagrammatically indicated in Fig. 7, attached to chassis 1.

Front and back mountings and shaft structure are designed for temperature correction, allowing expansion of shaft 17 to compensate for expansion of the steel thereby avoiding or reducing frequency drift.

In this way condensers 9 and 10 having plungers supported on adjustment bracket 16 can be adjusted in their capacity.

More specifically, as already stated above, condenser 9 will be adjusted by the axial movement of plunger 14 with respect to its electrodes 12, 12'.

In addition to the movement of plunger 14 under control of adjustment bracket 16, plunger tube 14 is additionally adjustable with respect to its supporting insulating tube in the following manner:

Plunger tube 14 is attached to an axial screw bolt 19 which is rotatably supported in a metal sleeve acting as a nut member 20 mounted on adjustment bracket 16. By rotating screw bolt 19 in one or the other direction while holding plunger tube 14, plunger tube 14 attached thereto will be forced to move axially over screw bolt 19 in one or the other direction thereby causing plunger tube 14 slidingly to move over its supporting insulating tube 15 in the one or the other direction. In this way the axial position of plunger tube 14 with respect to bracket 16 and thereby the zero or rest position of plunger tube 14 with respect to electrodes 12, 12' is adjusted.

Condenser 10 is substantially similar in construction although different in dimension and support from condenser 9.

Condenser 10 is also shown to consist of an insulating tube of "Nonex" glass indicated at 21 and provided with a pair of cylindrical electrodes applied in a manner similar to that indicated for condenser 9 and designated at 22, 22' respectively.

Condenser 10 is supported on side flaps 7, 7' which are electrically as well as mechanically connected to electrodes 22, 22' respectively by means of solder points indicated in Figs. 3 and 4 at 23, 23' respectively.

Adjustment of condenser 10 is caused to occur by means of a plunger 24 axially adjustable with one end within condenser tube 21 and fixedly supported at its other end on adjustment bracket 16.

In accordance with another feature of the invention one of the plungers of condensers 9, 10 is arranged to slide in its associated condenser tube 11, 21 respectively as the case may be with a lesser degree of tolerance than in the other of condenser tubes 11, 21.

In this particular case, plunger 24 which is not adjustable with respect to adjustment bracket 16, is arranged to slide in condenser tube 21 with a very close tolerance amounting to substantial physical contact with the inner surface of condenser tube 21.

On the other hand plunger 14 is arranged to slide in its associated condenser tube 11 with a greater amount of tolerance or substantially out of physical contact with the inner surface of condenser tube 11.

In this way the two condensers 9, 10 can be made adjustable substantially simultaneously as well as independently; more specifically condenser 9 can be additionally adjusted axially and substantially independently from condenser 10.

In addition to side flaps 6, 6' and 7, 7' providing mechanical support and electrical connection for condensers 9 and 10 respectively, in accordance with another feature of the invention, there are provided further side flaps projecting from other portions of inductance plate 2 and forming electrical connections as well as matching and supporting elements if necessary for other elements of the circuitry to which the tuning device in accordance with this invention is to be connected.

In accordance with a particular embodiment of the invention there are provided side flaps on other sides of inductance plate 2, preferably on sides extending perpendicular to the sides of inductance plate 2 from which condenser supporting side flaps 6, 6' and 7, 7' are shown to extend.

As apparent from Figs. 2 and 3 a pair of side flaps 27, 27' are arranged to extend angularly from the ends of inductance plate 2 and from points near or close to side flaps 6, 6', which connect the inductance plate or tuning circuit to the input terminals 28, 28' of the tuning device.

Another pair of side flaps are arranged at the opposite side of the tuning device. They are of approximate T-shape and extend from the side near side Figs. 7, 7' of inductance plate 2 first into a direction perpendicular to the axis of condenser 10, then in a direction parallel to the axis of condenser 10 and thereafter in a direction perpendicular to the plane of inductance plate 2 and substantially parallel to side flaps 6, 6', 7, 7'. These additional side flaps which already have been designated previously by 8, 8' serve to connect the tuning circuit over inductances 29, 30 to the contacts of a tube socket but also if necessary to other parts of the tuning device as schematically indicated in Fig. 1 by conductors 31, 32 respectively.

In order further to adjust the value of the tuning inductance there are provided on condensers 9, 10 or at least on one of them, conducting plates forming a parallel inductance path extending in a direction substantially perpendicular to the plane of inductance plate 2 or passing through the axis of condensers 9, 10 respectively.

These parallel inductance paths serve the double purpose of adjusting tuning and also to provide a take off tap for a crystal diode mixer which must match at a predetermined percentage of the total input.

In addition to connecting the outer ends of electrodes 22, 22' to supporting flaps 7, 7', the inner ends of electrodes 22, 22' are connected through rings 25, 25' respectively to contacts of a tube socket 26 supported on inductance plate 2 so that at one side of inductance plate 2 the contacts of socket 25 will project while on the opposite side of socket 25 the receiving openings for the tube pins will be apparent as schematically indicated for example in Fig. 3 at 26'.

In this way, connections between condenser electrodes and other circuit elements for example the electrode of an oscillator and/or mixer tube supported on socket 26 are held to a minimum.

Parallel inductance plates of this type are indicated in Fig. 4 at 33, 34 respectively with side views being shown in Figs. 5 and 6 respectively at an enlarged scale.

One of these parallel inductance plates shown in Fig. 4 at 33 and in Fig. 5 at an enlarged scale, consists of a substantially quadrangular metal stamping of approximately U shape with the ends of the U being connected to and supported on electrodes 11, 11' of condenser 9 by means of solder points schematically indicated in Figs. 2 and 4 at 35, 35' respectively.

The tuning effect of shunting plate 33 can be adjusted by providing inside its U shaped form a central flap 36 of approximately triangular or trapezoidal shape which is also stamped out of one piece with plate 33 and the position of which can be adjusted by bending flap 36 inwardly or outwardly out of the plane of plate 33.

In a similar form as plate 33 and in a similar manner, parallel inductance plate 34 is electrically and mechanically connected to and supported on electrodes 21, 21' by means of solder points indicated in Figs. 2 and 4 at 37, 37' respectively.

If necessary, a further adjustment of the parallel inductance effect of at least one of plates 33, 34 can be realized in the manner as for example indicated on plate 33 by providing a further flap 38 projecting perpendicular to the plane of plate 33.

At the same time parallel inductance plates 33, 34 can be used to support circuit elements in an appropriate manner with or without the provision of additional flaps, all this without exceeding the scope of the invention.

For example in the embodiment of the invention shown in Fig. 1 through 6 parallel inductance plate 33 is provided with an inner connection for connecting plate 33 to elements of the circuitry if necessary.

Furthermore in the embodiment of the invention shown, this inner connection of plate 33 is formed as a lead-through condenser 39 of otherwise well known construction which is arranged in accordance with the matching requirements of the circuits concerned in an off-center position with respect to plate 33.

Between the lead-through electrode or wire 40 of condenser 39 and perpendicular flap 38 of plate 33 there is arranged supported on and connected to lead 40 and flap 38 a crystal diode indicated in Figs. 2 to 4 and at 41.

In a further embodiment of the invention a shunting element is provided on at least one of condensers 9, 10 in the form of an adjustable trimming condenser 44 supported on conducting but capacity reducing flaps 42, 42′ connecting respectively to electrodes 11, 11′ by means of solder points 43, 43′ respectively.

Trimmer condenser 44 is of otherwise well known construction and adjustable in known manner.

The invention is not limited to the form or arrangement of flaps and connecting elements, illustrated and described, but may be applied in any form or manner whatsoever without departing from the scope of this invention.

Other circuit elements and/or connections are supported in well known manner on the bottom and top sides respectively of chassis 1 such as transformer 45, electrolytic filter condenser 46, rectifier stack 47 which are arranged on top of chassis 1, while the bottom of chassis 1 or its top panel supports a multiposition switch 48 operated by a lever 49.

Additional connection terminals are provided on the side of chassis 1 at 50 and the bottom of chassis 1 may be covered up in otherwise well known manner with an appropriate cover plate, not shown.

As stated before, condensers 9, 10 can be manufactured in well known manner without departing from the scope of this disclosure.

However, in accordance with this invention and in a manner particularly useful for the purpose of this invention, especially for the simultaneous realization of electrical connection and mechanical support of adjustable condensers on side flaps of an inductance plate, the cylindrical condenser electrodes 11, 11′ and 21, 21′ are produced, instead of by coating or in any other known manner, by fitting over the supporting insulator tube, pairs of metallic sleeves with rather thin walls of the order .30 inch.

In this way the manufacture of condensers is extremely simplified while at the same time electrodes are realized which are relatively strong and permit direct attachment by soldering or othewise of connecting elements such as side flaps of an inductance plate, in the manner shown in Figs. 1 through 7 in accordance with certain principles of this invention.

In a specific embodiment of the invention, electrodes such as shown at 11, 11′ and 21, 21′ in the form of thin walled cylindrical sleeves are slipped over the supporting tube by first heating the cylindrical sleeves thereby expanding their diameter and then, while they are hot, slipping the sleeve over opposite ends respectively of the supporting tube, f. e. a "Nonex" tube. After cooling the "Nonex" tube down secure adherence of the electrodes on the associated supporting tube is achieved.

In addition to pre-heating the cylindrical sleeves as stated above, such sleeves can be pre-expanded or stretched before being slipped over an expanding tool consisting of two or more cylindrical sectors. Before or at the same time or immediately thereafter the sleeves are heated to keep them expanded for a pre-determined time and during that time and while they remain expanded, they are slipped over the mounting tube.

It is also feasible although not as practical as previously provided to provide merely an expansion of the cylindrical sleeves and to insert the mounting tube into these sleeves while these sleeves are being expanded. However such an arrangement requires special mounting machinery.

Figs. 7 and 8 illustrate another embodiment of the invention facilitating the combination with or connection to a tuning device such as illustrated in Figs. 1–6 or of a vacuum tube serving as an oscillator and/or mixer tube and substantially supported on an inductance plate such as shown in Figs. 1–6 at 2. As illustrated in Figs. 1–8 such a tube or an associated tube socket is supported in a manner which permits easy detachment and attachment of the tube without interfering with any other part of the tuning device.

For this purpose, as stated above, inductance plate 2 supports a socket 25 the contact parts or terminals of which are pointing to the inside of chassis 1 while the tube receiving parts or openings 26 are pointing to the outside of chassis 1.

According to Figs. 7 and 8, cooperating with socket 25 and openings 26, there is arranged in top panel 51′ of chassis 1 an opening 52 the edge of which contains peripheral portions indicated in Figs. 1, 7 and 8 at 53, 53′ respectively which are slightly raised with respect to the remaining peripheral portions 51, 51′ of opening 52 and which are separated from these remaining peripheral portions 54, 54′ by means of stamped slots 55.

Raised portions 53, 53′ serve to cooperate with or to guide corresponding one or more projecting cutouts in tube cover 56. Such cutout is indicated in Fig. 7 at 57 and it is produced by simply forcing a triangular portion of the lower edge of cover tube 56 to be cut in and bent back out of the cylindrical plane of tube cover 56.

In this way it is possible first with cutout 57 being arranged over an unraised portion 54 or 54′ to push tube cover 56 in axial direction into opening 52 into such a position that the raised portions 53, 53′ of opening 52 will be able to move over triangular cutout as soon as tube cover 56 is rotated. As soon as one of the raised portions 53, 53′ is moved over cutout 57, it will be impossible to remove tube cover 56 by a simple axial movement and tube cover 56 will be well secured in its position over opening 52 and the vacuum tube schematically indicated at 58 projecting therefrom and mounted in socket 25 will be well shielded mechanically as well as electrically.

In order to remove tube 58 from socket 25 and therefore to remove tube cover 56, it is only necessary to rotate tube cover 56 in opening 52 until projecting cutout portion 57 which in the fixed position of tube cover 56 is arranged underneath one of projecting peripheral portions 53, 53′, will come out from under this peripheral portion, thereby releasing tube cover 56 from its attachment to chassis panel 51. This also reduces lead inductance to a minimum.

In the circuit diagram of Fig. 9, the elements shown in Figs. 1–6 are indicated in substantially the same manner as in Figs. 1–6.

More specifically the two adjustable condensers with capacity C are indicated at 9, 10. The common inductance plate is indicated at 2. The trimming condenser having an inductance C is indicated at 44.

The shunting inductances are indicated at 33, 34 respectively. Lead through condenser and crystal diode are indicated at 39, 41 respectively. The tube supported on socket 25 is indicated at 58 while transformer 45 connects the line plug 59 over rectifier 47, filter 46, tube 58 and the oscillation IRF amplifier and mixer circuit on one side to terminals 28, 28′ on the other side over two deck switch 48 to terminals 50. Plate and cathode chokes are indicated at 29, 30 connected to lead through condensers 51, 51' respectively supported on flaps 8, 8' respectively.

While the invention has been described in connection with an inductance plate supporting several adjustable condensers, it can be applied without departing from the scope of this disclosure to an inductance plate supporting only one adjustable condenser or supporting more than two adjustable condensers.

Nor is the invention limited to shape, form, type and arrangement of condenser, inductance or any other circuit element as described and illustrated, but it may be applied in any form whatsoever without departing from the scope of this invention.

I claim:

1. In a high frequency tuning device, an inductance formed as a base plate having a central portion generally conforming to the shape of a tube socket, and having a tube socket attached thereto; said central portion having at least one arm radially extending from said central portion and two more arms also radially extending from said central portion at diametrical parts thereof and in a direction substantially perpendicular to said first radial arm; said first arm extending at its free end into an approximately U-shaped strip and said two arms forming a second approximately U-shaped strip extending substantially parallel to said first U-shaped strip, a pair of tuning capacities, each formed of an array of coaxially juxtaposed cylindrical electrodes bridging said U-shaped strips and supported on and conductively connected over said U-shaped strips to said central portion; each of said electrode arrays being provided with a conducting plunger axially adjustable within and with respect to said electrode array, and means for adjusting said conducting plungers substantially simultaneously, there being provided further: a conducting plate forming a parallel inductance path bridging the electrodes of at least one of said tuning capacities and arranged above said electrodes in a plane passing through the common axis of said electrodes and arranged substantially perpendicular to the plane of said central portion.

2. Device according to claim 1 wherein said conducting plate has a cut-out bridging the space separating said electrodes and a flap in said cut-out movable with respect to said conducting plate so as to vary tuning.

3. Device according to claim 1 wherein said conducting plate has an inner flap bendable with respect to its plane so as to vary tuning.

4. Device according to claim 1 wherein said conducting plate has a side flap and an off-center connection, and a crystal diode supported thereon and arranged between said side flap and said off-center connection; said off-center connection forming the lead of a lead-through condenser supported on said shunting plate in said off-center position.

5. In a high frequency tuning device, an inductance formed as a base plate having a central portion generally conforming to the shape of a tube socket, and having a tube socket attached thereto; said central portion having at least one arm radially extending from said central portion and two more arms also radially extending from said central portion at diametrical parts thereof and in a direction substantially perpendicular to said first radial arm; said first arm extending at its free end into an approximately U-shaped strip and said two arms forming a second approximately U-shaped strip extending substantially parallel to said first U-shaped strip, a pair of tuning capacities, each formed of an array of coaxially juxtaposed cylindrical electrodes bridging said U-shaped strips and supported on and conductively connected over said U-shaped strips to said central portion; each of said electrode arrays being provided with a conducting plunger axially adjustable within and with respect to said electrode array, and means for adjusting said conducting plungers substantially simultaneously and each of said electrode arrays being provided with a conducting plate forming a parallel inductance path arranged bridging said electrodes and supported thereon above said electrodes in a plane extending through axis of said electrodes and substantially perpendicular to said central portion, one of said shunting plates being provided with an inner flap adjustable with respect to the plane of said shunting plate to vary tuning.

6. In a high frequency tuning device, an inductance formed as a base plate having a central portion generally conforming to the shape of a tube socket, and having a tube socket attached thereto; said central portion having at least one arm radially extending from said central portion and two more arms also radially extending from said central portion at diametrical parts thereof and in a direction substantially perpendicular to said first radial arm; said first arm extending at its free end into an approximately U-shaped strip and said two arms forming a second approximately U-shaped strip extending substantially parallel to said first U-shaped strip, a pair of tuning capacities, each formed of an array of coaxially juxtaposed cylindrical electrodes bridging said U-shaped strips and supported on and conductively connected over said U-shaped strips to said central portion; each of said electrode arrays being provided with a conducting plunger axially adjustable within and with respect to said electrode array, and means for adjusting said conducting plungers substantially simultaneously and each of said electrode arrays being provided with a conducting plate forming a parallel inductance path arranged bridging said electrodes and supported thereon above said electrodes in a plane extending through the axis of said electrodes and substantially perpendicular to said central portion, one of said shunting plates being provided with an inner flap adjustable with respect to the plane of said shunting plate to vary tuning, and also being provided with a side flap and an off-center connection; and a crystal diode supported on and arranged between said side flap and said off-center connection; said off-center connection forming the lead of a lead-through condenser supported on said conducting plate in an off-center position.

7. In a high frequency tuning device, a chassis panel having an opening adapted to permit passage of a vacuum tube, a tuning inductance formed as a base plate having a central portion generally conforming to the shape of a tube socket, and having a socket attached thereto; said central portion being arranged on said chassis underneath thereof in a position where said tube socket faces said tube opening; and said central portion having at least one arm radially extending therefrom, and two more arms also radially extending therefrom at diametrical parts of said central portion and in a direction substantially perpendicular to said first radial arm; said first arm and the two arms extending each into two U-shaped strips arranged substantially parallel to each other and supporting each one tuning capacity; said tuning capacity being formed of a pair of coaxially juxtaposed cylindrical electrodes bridging said U-shaped strips and supported on and conductively connected through said U-shaped strips with said central portion; each of said electrode pairs being provided with a conducting plunger axially adjustable within and with respect to said electrode pairs; said panel opening having at least one raised edge portion projecting from said plane of said chassis panel to the side of said chassis panel away from said central portion; and an open ended cylindrical cover fitting over said opening and having at its lower edge at least one flap projecting from its cylindrical surface; said edge flap of said panel opening and said cover flap adapted respectively to cooperate with each other so that under control of a rotating movement of said cover with respect to said chassis panel said projecting flap will slide over the unprojected portion of said panel opening and underneath the projecting portion of said panel opening, thereby fixing said cover on said chassis panel and over said opening in a position preventing said cover to be removed from said opening by an axial movement.

8. Device according to claim 6 wherein said adjusting means include a common bracket supporting said plungers at their ends projecting from said electrode pairs; and means for adjustably supporting said bracket on said chassis panel, said latter supporting means including a plate attached to said chassis panel in the space between said condenser electrode pairs and near the outer ends of one of said electrodes, and extending in a plane substantially perpendicular to said chasis panel, a threaded bolt rotatably supported on said bracket and extending into a direction substantially parallel to the axis of said electrodes; said common bracket being supported on said bolt with a thread fitting to the thread of said bolt and cooperating with said bolt so as to cause said bracket upon rotation of said bolt to be moved into the direction of the axis of said bolt, thereby causing said plungers to be adjusted axially and simultaneously with respect to the electrode pairs associated with each of said plungers respectively; one of said plungers being fixedly attached to said common bracket, and the other of said plungers being adjustably attached to said common bracket.

References Cited in the file of this patent

UNITED STATES PATENTS

| | | |
|---|---|---|
| 1,727,755 | Dickinson | Sept. 10, 1929 |
| 2,217,984 | Kirk | Oct. 15, 1940 |
| 2,310,323 | Sharp | Feb. 9, 1943 |
| 2,412,271 | Kercher | Dec. 10, 1946 |
| 2,438,477 | Dodds | Mar. 23, 1948 |
| 2,499,612 | Staver | Mar. 7, 1950 |
| 2,667,581 | Auerbacher et al. | Jan. 26, 1954 |
| 2,677,769 | Fathauer | May 4, 1954 |
| 2,714,192 | Pan | July 26, 1955 |
| 2,727,147 | Craumer | Dec. 13, 1955 |
| 2,727,148 | Slate | Dec. 13, 1955 |